(12) United States Patent
Ehlert et al.

(10) Patent No.: US 6,267,815 B1
(45) Date of Patent: Jul. 31, 2001

(54) METHOD FOR PULLING A SINGLE CRYSTAL

(75) Inventors: Andreas Ehlert, Mehring; Erich Dornberger, Burghausen, both of (DE); Wilfried Von Ammon, Hochburg (AT)

(73) Assignee: Wacker Siltronic Gesellschaft für Halbleitermaterialien AG, Burghausen (DE)

( * ) Notice: Subject to any disclaimer, the term of this patent is extended or adjusted under 35 U.S.C. 154(b) by 0 days.

(21) Appl. No.: 09/413,711

(22) Filed: Oct. 5, 1999

(30) Foreign Application Priority Data

Oct. 15, 1998 (DE) .............................. 198 47 695

(51) Int. Cl.$^7$ .................................................. C30B 15/02
(52) U.S. Cl. ................................................................ 117/13
(58) Field of Search ......................................... 117/13, 14

(56) References Cited

U.S. PATENT DOCUMENTS 5,078,830    1/1992   Shirata et al. .
6,048,395  * 4/2000   Iida et al. ............................. 117/210
6,120,599  * 9/2000   Iida et al. ............................. 117/20

FOREIGN PATENT DOCUMENTS 0 866 150    9/1998  (EP) .

OTHER PUBLICATIONS

W.C. Dash, J. Appl. Phys. 29 (1958), 736–737.
E. Dornberger and W.U. Ammar, Journal of the Electrochem. Soc., vol. 143, No. 5, May 1996, 1648–1653 English Abstract Corresponding to EP 0 866 150 A1.

* cited by examiner

Primary Examiner—Felisa Hiteshew
(74) Attorney, Agent, or Firm—Collard & Roe, P.C.

(57) ABSTRACT

A method for pulling a single crystal has a monocrystalline seed crystal being brought into contact with molten material and an interface being formed between solid and molten material, and molten material being caused to solidify with the formation of a thin-necked crystal and a cylindrical single crystal. The method is one wherein, during the pulling of the thin-necked crystal, it is ensured that the ratio V/G(r) is above a constant $C_{crit}$ having the value $1.3*10^{-3}$ cm$^2$/Kmin, with V being the pulling rate, with G(r) being the axial temperature gradient at the interface and r being the radial distance from the center of the thin-necked crystal.

7 Claims, 5 Drawing Sheets

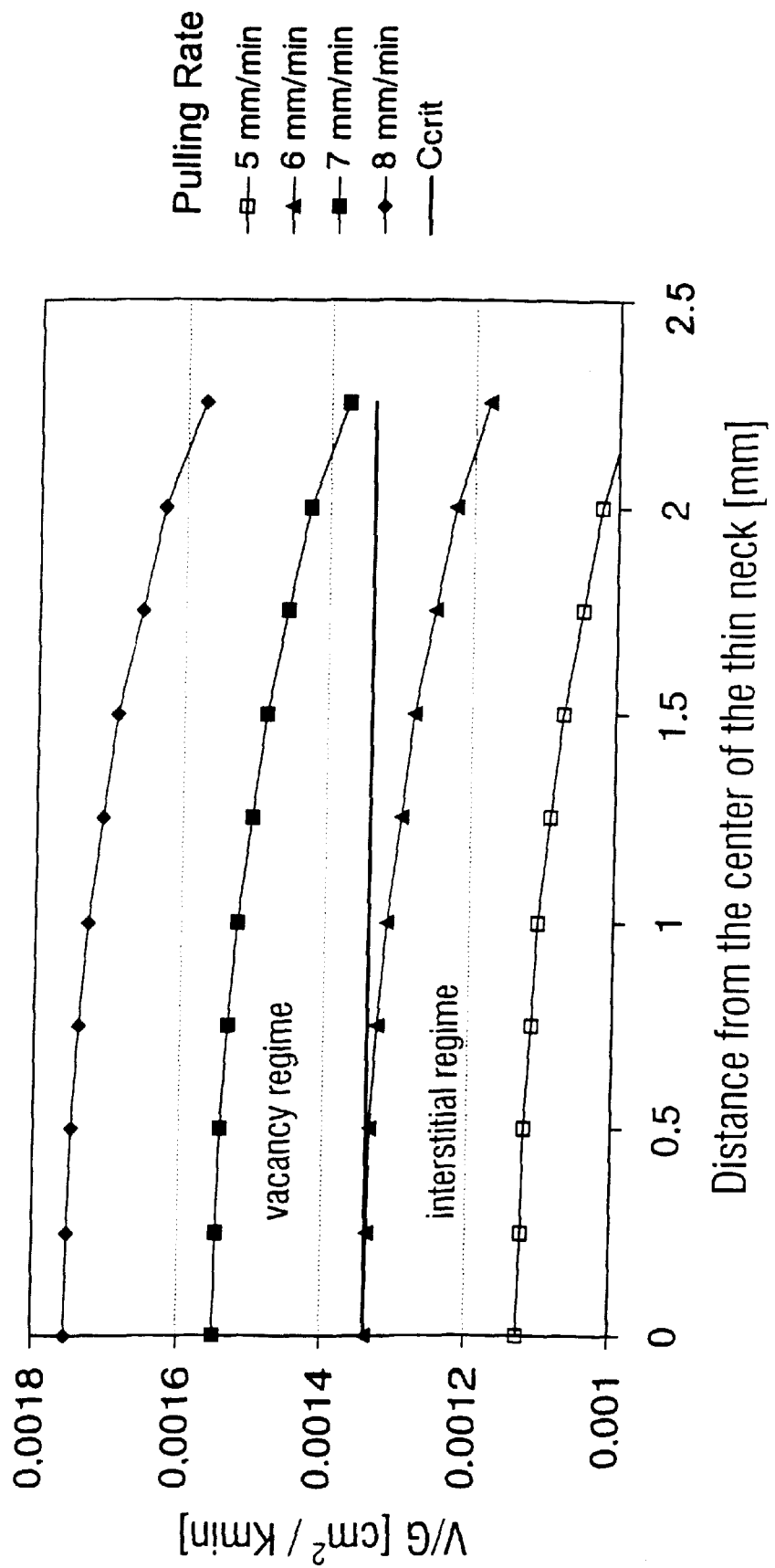
Fig. 1  Radial Profile of V/G(r) for thin neck (pulling process 1)

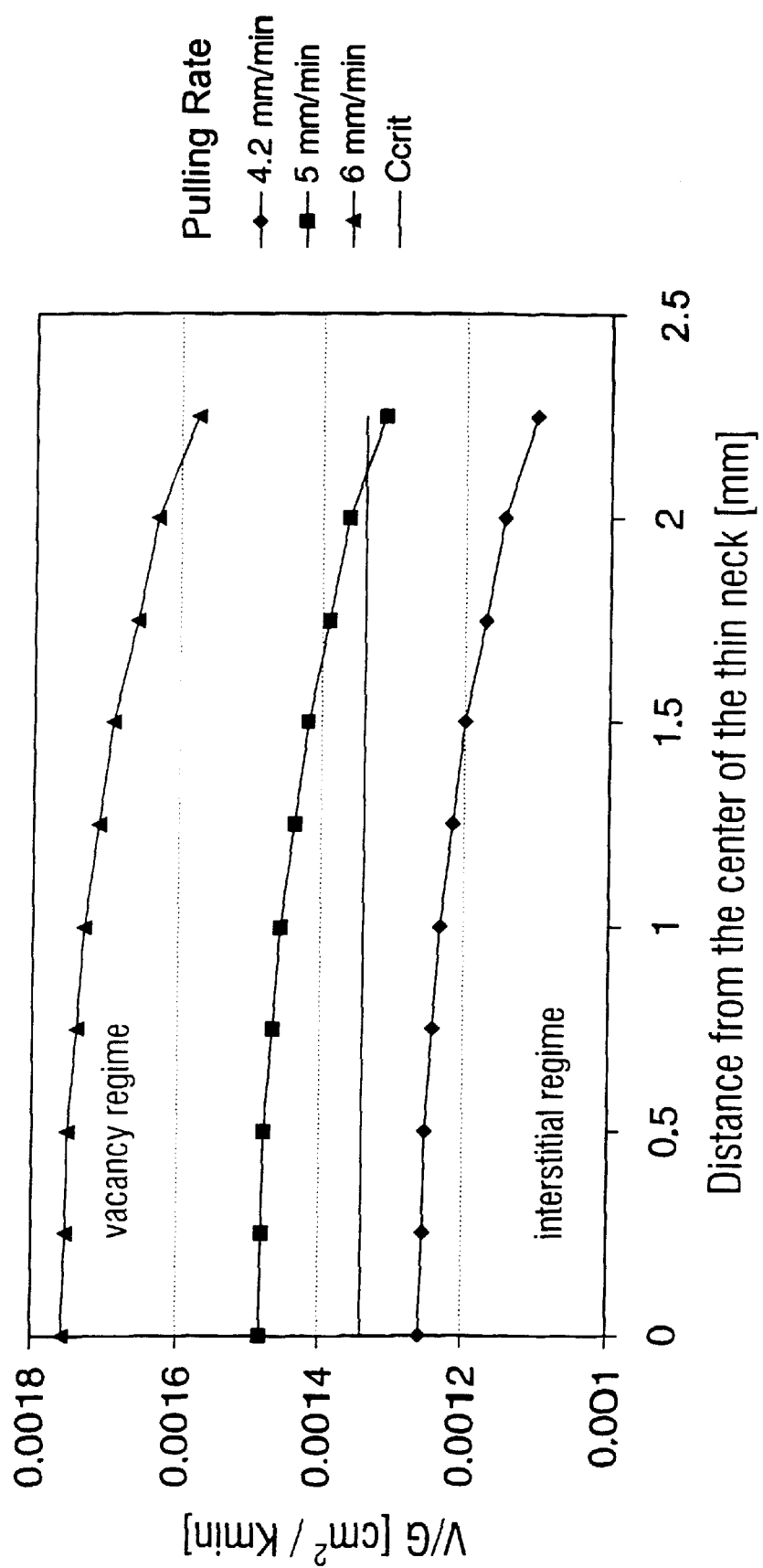
Fig. 2 Radial Profile of V/G(r) for thin neck (pulling process 2)

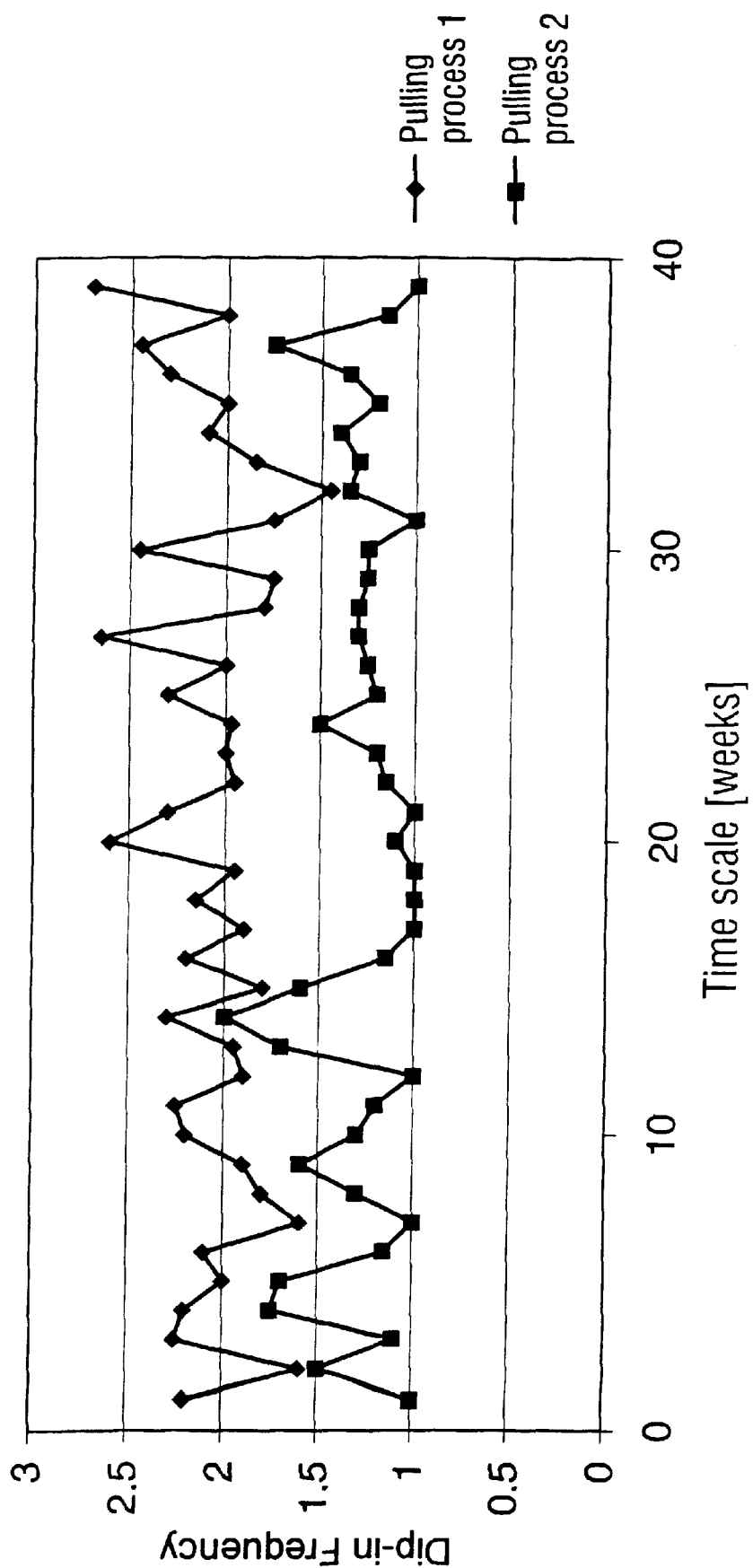

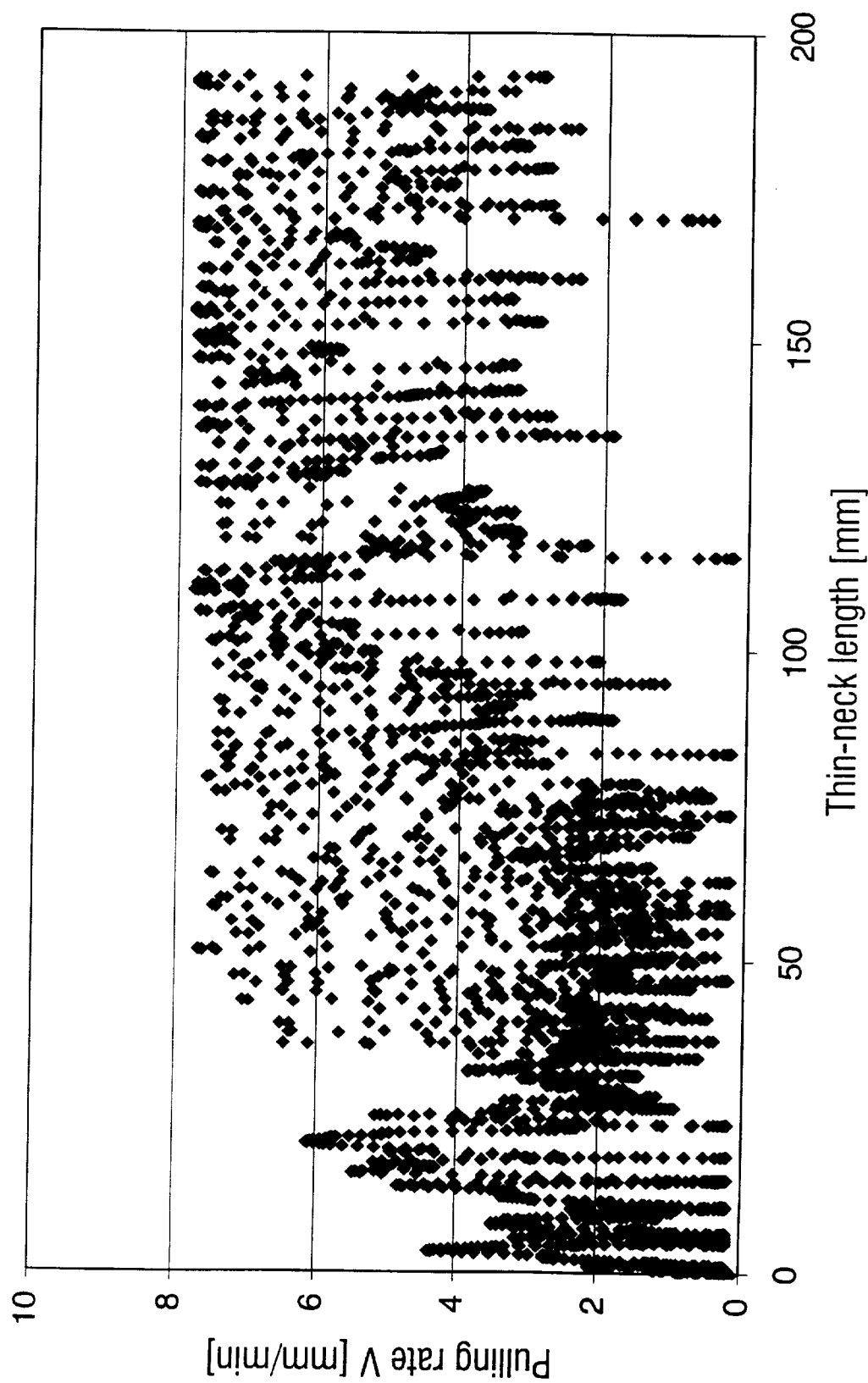
Fig. 4a  Experiment 1

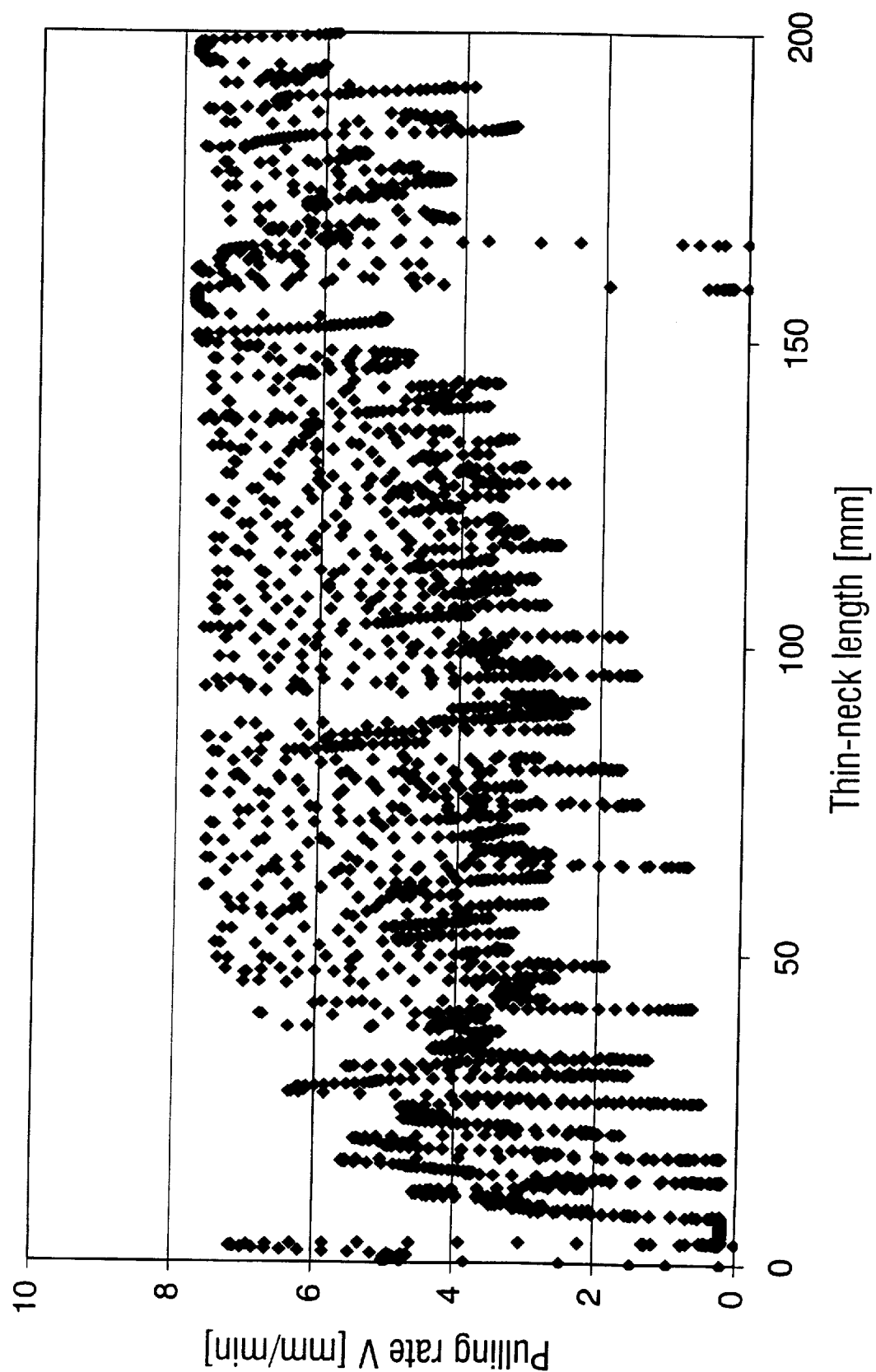
Fig. 4·b Experiment 2

METHOD FOR PULLING A SINGLE CRYSTAL

BACKGROUND OF THE INVENTION

1. Field of the Invention

The present invention relates to a method for pulling a silicon single crystal which has a monocrystalline solid seed crystal of silicon being brought into contact with molten silicon material and an interface being formed between solid seed crystal and molten material, and the molten silicon material being caused to solidify with the formation of a thin-necked crystal and a cylindrical single crystal. The method is one wherein, during the pulling of the thin-necked crystal, it is ensured that the ratio $V/G(r)$ is above a constant $C_{crit}$ having the value $1.3*10^{-3}$ cm$^2$/Kmin, with V being the pulling rate, with $G(r)$ being the axial temperature gradient at the interface and r being the radial distance from the center of the thin-necked crystal.

2. The Prior Art

The most frequently used methods for pulling a single crystal by solidifying molten material are the Czochralski method (CZ method) and the float zone method (FZ method). These methods are described, for example, in *Semiconductor Silicon Crystal Technology* by F. Shimura (Academic Press, London 1988, pages 124–127, 130–131 and 135) with reference to the example of producing silicon single crystals.

The production of silicon single crystals using the aforementioned methods is divided into several phases. After polycrystalline silicon (polysilicon) has been melted, a seed crystal of given crystal orientation is brought into contact with the melt. Then a 2–3 mm wide and several centimeters long thin-necked crystal is pulled, whose diameter is subsequently increased to the target diameter of the silicon single crystal to be produced. The phase of pulling the thin-necked crystal is used to eliminate dislocations present in the seed crystal and is carried out in the prior art according to Dash's principle (W. C. Dash, *J. Appl. Phys.* 29 (1958), 736–737). If, during this phase, the dislocations are not successfully eliminated, then it is not subsequently possible to produce a dislocation-free silicon single crystal.

Such silicon single crystals are the basic material for electronic components whose functional capacity depends, for example, on the freedom of the basic material from defects. Thus there is the requirement for defect-free and therefore also dislocation-free single crystals as a result.

In relation to the production of silicon single crystals, a study has been published (E. Dornberger and W. v. Ammon, *Journal of the Electrochem. Soc.*, Vol. 143, No. 5, May 1996, 1648–1653). This study links the occurrence of particular crystal defects when pulling a single crystal with particular parameters which play a role in the pulling of the single crystal.

SUMMARY OF THE INVENTION

It has now been found according to the present invention that, for the production of a single crystal, it is not only the conditions during the pulling of the single crystal that are of particular importance. The single crystal can be made from semiconductor material, preferably from silicon.

The present invention relates to a method for pulling a single crystal, in which a monocrystalline solid seed crystal is brought into contact with molten material and an interface is formed between solid and molten material. Molten material is then caused to solidify with the formation of a thin-necked crystal and a cylindrical single crystal. During the pulling of the thin-necked crystal, it is ensured that the ratio $V/G(r)$ is above a constant $C_{crit}$ having the value $1.3*10^{-3}$cm$^2$/Kmin, with V being the pulling rate, $G(r)$ being the axial temperature gradient at the interface and r being the radial distance from the center of the thin-necked crystal. The solid seed crystal and the molten material are semiconductor material, preferably silicon.

It has been found that, when employing the method of the invention, the risk of forming dislocations is reduced when the single crystal is being pulled. Therefore, the dip-in frequency (number of attempts needed to produce a dislocation-free single crystal) decreases as well as the dip-in time (time from first contact between the seed crystal and the silicon melt to completion of the pulling of the thin-necked crystal) decreases.

The ratio $V/G(r)$ can be increased, and thus brought into the desired range, by increasing the pulling rate for given thermal conditions. Another alternative is to reduce the axial temperature gradient at the interface, for example by providing an appropriately designed heat shield around the thin-necked crystal which is preferably removable and adjustable.

BRIEF DESCRIPTION OF THE DRAWINGS

Other objects and features of the present invention will become apparent from the following detailed description considered in connection with the accompanying drawings which discloses several embodiments of the present invention. It should be understood, however, that the drawings are designed for the purpose of illustration only and not as a definition of the limits of the invention.

In the drawings, wherein similar reference characters denote similar elements throughout the several views:

FIG. 1 shows the ratio of V/G for pulling process 1;

FIG. 2 shows the ratio of V/G for pulling process 2;

FIG. 3 shows the frequency of accretion for pulling process 1 and for pulling process 2;

FIG. 4a shows the pulling rate for Experiment 1; and

FIG. 4b shows the pulling rate for Experiment 2.

DETAILED DESCRIPTION OF PREFERRED EMBODIMENTS

Turning now in detail to the drawings, FIGS. 1 and 2 show the calculated ratio $V/G(r)$ plotted against r of the thin-necked crystal. The bold line has the value $C_{crit}$ and separates regions in which vacancy defects (vacancy regime) and interstitial defects (interstitial regime) respectively predominate in the thin-necked crystal. FIG. 1 and FIG. 2 differ, in particular, in that in the pulling experiments represented in FIG. 2 (pulling process 2), a heat shield was used which produced a larger $G(r)$ than the heat shield used in the experiments according to FIG. 1 (pulling process 1). The increase in $G(r)$ for an otherwise identical pulling rate V leads to a reduction in the ratio $V/G(r)$. Therefore, this leads to an increased risk that the ratio $V/G(r)$ drop below the critical constant $C_{crit}$ into the range in which interstitial defects dominate in the silicon single crystal (interstitial regime).

The examples below further illustrate the effectiveness of the method of the invention in the industrial production of silicon single crystals. A Czochralski crystal-pulling system corresponding to the prior art was used for carrying out the experiments below. The initial mass of high-purity polysilicon was 70 kg.

EXAMPLE 1

The effect of the ratio V/G(r) on the dip-in frequency is demonstrated in FIG. 3. In this figure, the dip-in frequencies of two pulling processes are represented and compared with one another over an evaluation period of 40 weeks. Pulling process 2 is characterized in that, compared with pulling process 1, it has a higher ratio V/G(r) for otherwise identical pulling conditions (cf. also FIGS. 1 and 2). By increasing the ratio V/G(r) during the thin-necked pulling into the vacancy regime range, the risk of forming dislocations is reduced and, therefore, in the optimized pulling process (pulling process 2), the dip-in frequency is reduced.

EXAMPLE 2

It is also possible to increase the ratio V/G(r) by raising the pulling rate V, which is demonstrated in FIGS. 4a and 4b. In both experiments, the average pulling rate was increased from the start to the end of the thin-necked crystal with otherwise identical pulling conditions during the thin-necked pulling. In both cases, the pulling rate did not exceed a maximum of 8 mm/min. Experiment 1 did not lead to a dislocation-free thin neck, and therefore not to a dislocation-free silicon single crystal either. Through optimization of the pulling rate, Experiment 2 led to a dislocation-free thin-necked crystal, and therefore to a dislocation-free silicon single crystal as well. In Experiment 1, the pulling rate in the last part of the thin-necked crystal (170–200 mm region) was typically between 2 and 8 mm/min. In Experiment 2, the pulling rate in the last part of the thin-necked crystal (170–200 mm region) was typically between 4 and 8 mm/min. This increase in the pulling rate in Experiment 2 was sufficient for producing a dislocation-free single crystal.

Accordingly, while a few embodiments of the present invention have been shown and described, it is to be understood that many changes and modifications may be made thereunto without departing from the spirit and scope of the invention as defined in the appended claims.

What is claimed is:

1. A method for pulling a single crystal, comprising bringing a monocrystalline solid seed crystal into contact with a molten material and forming an interface between said solid crystal and said molten material;

causing said molten material to solidify with the formation of a thin-necked crystal and a cylindrical single crystal; and during pulling of the thin-necked crystal, ensuring that a ratio V/G(r) is above a constant $C_{crit}$ having a value $1.3*10^{-3}$ cm$^2$/Kmin, with V being a pulling rate, G(r) being an axial temperature gradient at the interface and r being a radial distance from a center of the thin-necked crystal.

2. The method as claimed in claim 1, comprising pulling the single crystal using Czochralski method.

3. The method as claimed in claim 1, comprising pulling the single crystal using float zone method.

4. The method as claimed in claim 1, comprising providing a heat shield for pulling the thin-necked crystal.

5. The method as claimed in claim 1, comprising detaching a dislocation-free piece of the thin-necked crystal; and providing said dislocation-free piece as the seed crystal for pulling a single crystal.

6. The method as claimed in claim 1, wherein the single crystal is made of a material comprising a semiconductor material.

7. The method as claimed in claim 1, wherein the single crystal is made of silicon.

* * * * *